US009725933B2

United States Patent
Chen et al.

(10) Patent No.: US 9,725,933 B2
(45) Date of Patent: Aug. 8, 2017

(54) HANDLE STRUCTURE AND SERVER USING THE SAME

(71) Applicant: Super Micro Computer Inc., San Jose, CA (US)

(72) Inventors: Richard S. Chen, San Jose, CA (US); Ken-Sheng Lin, San Jose, CA (US); Chia-Cheng Lu, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 242 days.

(21) Appl. No.: 14/552,498

(22) Filed: Nov. 25, 2014

(65) Prior Publication Data

US 2016/0150659 A1    May 26, 2016

(51) Int. Cl.
| | | |
|---|---|---|
| *E05C 1/12* | (2006.01) | |
| *E05C 1/14* | (2006.01) | |
| *H05K 7/14* | (2006.01) | |
| *E05B 65/46* | (2017.01) | |
| *E05C 19/10* | (2006.01) | |
| *E05B 3/00* | (2006.01) | |

(52) U.S. Cl.
CPC .............. *E05C 1/145* (2013.01); *E05B 65/46* (2013.01); *E05C 1/14* (2013.01); *E05C 19/10* (2013.01); *H05K 7/1487* (2013.01)

(58) Field of Classification Search
CPC ......... Y10T 292/0911; Y10T 292/0926; Y10T 292/0932; Y10T 292/0949; Y10T 292/096; Y10T 292/0969; Y10T 292/0976; Y10T 292/0994; Y10T 292/102; Y10S 292/11; Y10S 292/31; E05C 1/004; E05C 1/08; E05C 1/085; E05C 1/12; E05C 1/14; E05C 1/145; E05C 19/10; H05K 5/0221; H05K 7/1487; E05B 65/46
See application file for complete search history.

(56) References Cited

U.S. PATENT DOCUMENTS

| | | | | |
|---|---|---|---|---|
| 5,820,175 A * | 10/1998 | Clavin | ..................... | E05C 1/145 292/153 |
| 6,109,669 A * | 8/2000 | Pinkow | ................... | E05C 1/145 292/175 |
| 6,152,501 A * | 11/2000 | Magi | ......................... | E05B 5/00 292/169 |
| 6,409,234 B1 * | 6/2002 | Larsen | .................... | E05C 1/145 292/173 |
| 6,547,289 B1 * | 4/2003 | Greenheck | ......... | A47B 88/0044 292/100 |
| 6,547,290 B1 * | 4/2003 | Zenner | ..................... | E05B 9/00 292/167 |

(Continued)

*Primary Examiner* — Alyson M Merlino
(74) *Attorney, Agent, or Firm* — Chun-Ming Shih; HDLS IPR Services (57) ABSTRACT

A handle structure (100) includes a shell (102), a handle (200), and a sliding member (300). An aperture (104) is provided on the shell (102). One end of the handle (200) pivots to the shell (102), and the handle (200) includes a pressing portion (210). The sliding member (300) is installed on the shell (102) corresponding to the handle (200). The sliding member (300) includes a hooking portion (310) penetrating the aperture (104) and a pressing area (302) pressed by the pressing portion (210) to move the hooking portion (310) from a first position (S) to a second position (E). By this arrangement, a case body can be easily pulled out and locked.

10 Claims, 7 Drawing Sheets

(56) References Cited

U.S. PATENT DOCUMENTS

| | | | | |
|---|---|---|---|---|
| 6,626,472 B1* | 9/2003 | Berg | ............... | E05B 13/002 |
| | | | | 292/336.3 |
| 7,301,778 B1* | 11/2007 | Fang | ............... | H05K 7/1487 |
| | | | | 312/223.2 |
| 7,318,532 B1* | 1/2008 | Lee | ............... | H05K 7/1405 |
| | | | | 211/26 |
| 2002/0171248 A1* | 11/2002 | Diss | ............... | E05B 83/30 |
| | | | | 292/164 |
| 2004/0113432 A1* | 6/2004 | Hall | ............... | E05B 63/14 |
| | | | | 292/66 |
| 2004/0119294 A1* | 6/2004 | Long | ............... | E05C 1/145 |
| | | | | 292/83 |
| 2004/0246695 A1* | 12/2004 | Schlack | ............... | H05K 7/1409 |
| | | | | 361/801 |
| 2005/0093304 A1* | 5/2005 | Figge | ............... | B60R 5/04 |
| | | | | 292/173 |
| 2005/0140150 A1* | 6/2005 | Hall | ............... | E05B 63/20 |
| | | | | 292/336.3 |
| 2006/0006664 A1* | 1/2006 | Pickar | ............... | E05B 17/007 |
| | | | | 292/167 |
| 2006/0033344 A1* | 2/2006 | Blake | ............... | B29C 45/16 |
| | | | | 292/173 |
| 2006/0274508 A1* | 12/2006 | LaRiviere | ............... | H05K 7/1488 |
| | | | | 361/727 |

* cited by examiner

HANDLE STRUCTURE AND SERVER USING THE SAME

BACKGROUND

1. Technical Field

The present invention relates to a handle structure, particularly to a handle structure and a server using the handle structure.

2. Related Art

A server is the core computer provides serving to each computer in a network system. The server can provide function such as storage and printing, etc. to the network users, and also allow the users to share all kinds of information and resources in the network environment. The basic structure of the server is the same as a personal computer, which consists of central processing unit (CPU), memory, and input/output units, and a bus for the interconnection. The CPU and memory are connected to a north bridge chip, and the input/output units are connected to a south bridge chip.

For example, a rack server has the outer appearance designed according to a uniform standard to be matched with the case shelf. In other words, the rack server is a tower server with an optimized structure. The design purpose for the rack server is to minimize the space taken by the server. Many professional network devices are designed as the rack server structure, particularly a flat type rack server which looks like a drawer. The width of this kind of rack server is 19 inches, and the height is about 22 U to 42 U (1 U=1.75 inches=44.45 millimeter).

The case body of the rack server is provided with a slidable bracket, and the user can adjust the height of the slidable bracket according to the height of the server to accommodate the internet equipment such as the servers, the hubs, or the shelves of the disk array. When the equipment in the case body needs to be assembled, detached, replaced, or fixed, the case is frequently pulled out/pushed back. Since most of the case shelves used nowadays are fixed by screws, the case body can only be pulled out of the case shelf after taking off the screws, which is time consuming and inconvenient.

Therefore, a solution that the users can rapidly detach, assemble, or achieve other goals, and also position the case body into the case shelf is needed to overcome the problems caused by the conventional technology.

BRIEF SUMMARY

The purpose of the present invention is to provide a handle structure which can easily pull out and lock the case body, and a server utilizing the aforementioned handle structure.

In order to achieve the aforementioned goal, the handle structure according to the present invention includes a shell, a handle, and a sliding member. An aperture is provided on the shell. One end of the handle pivots to the shell, and the handle includes a pressing portion. The sliding member is installed on the shell corresponding to the handle. The sliding member includes a hooking portion penetrating through the aperture and a pressing area pressed by the pressing portion to move the hooking portion from a first position (S) to a second position (E).

Another preferred embodiment of the present invention provides a server working with a case rack provided with a hooking hole. The server comprises a case body and two handle structures as disclosed in aforementioned embodiments. The case body can slidably be disposed inside the case rack. The two handle structures are disposed on both sides of the case body, respectively. The hooking portion engages with the hooking hole.

The present invention has the functions as follows. When the handle rotates relative to the shell, the pressing portion of the handle presses the pressing area to force the hooking portion of the sliding member to move to a lower end point, which is also known as the second position. Meanwhile, the hooking portion is disengaged from the hooking hole on the case rack, and the case box can be pulled out accordingly. Similarly, when the handle structure pushes the case box back to the case shelf, the hooking portion (with barbs at the end of the hook) can engage with the hooking hole by the elastic member, thus the hooking portion and the hooking hole can elastically engage with each other. In other words, the elastic member of the sliding member will be back to the original position and push the hooking portion back to the upper end point, which is known as the first position. Besides, in order to increase the anti-theft and locking function, the handle structure is further provided with a locking unit. The rotation of the locking unit drives the connecting member to rotate to be against the positioning groove of the handle, thereby restricting the rotation of the handle relative to the shell to achieve the anti-theft function. When the connecting member of the locking unit releases the restriction for the positioning groove, the handle can rotate relative to the shell and move the hooking portion.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
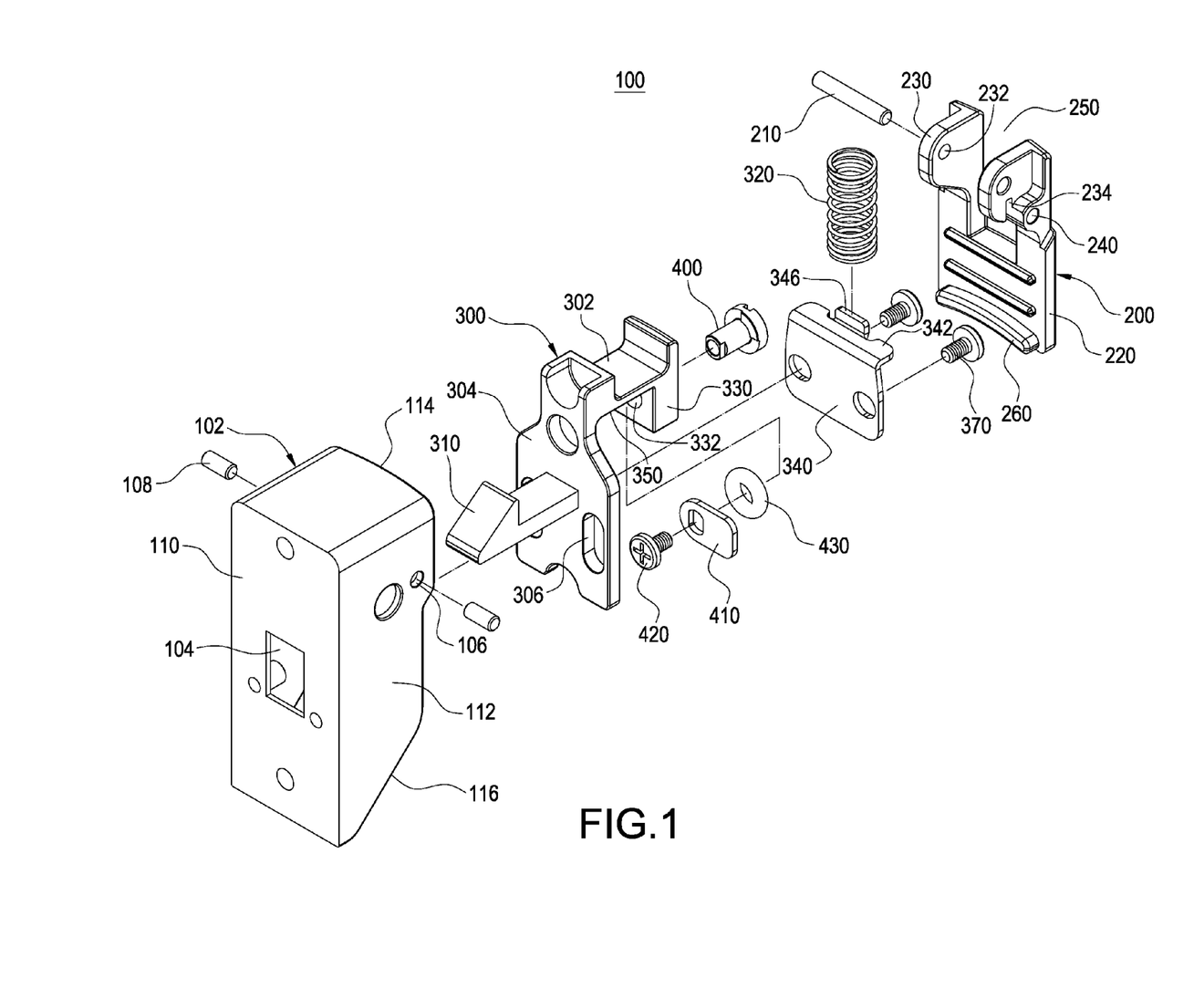
FIG. 1 is an exploded view of a handle structure in a first position according to the present invention.
Figure 2:
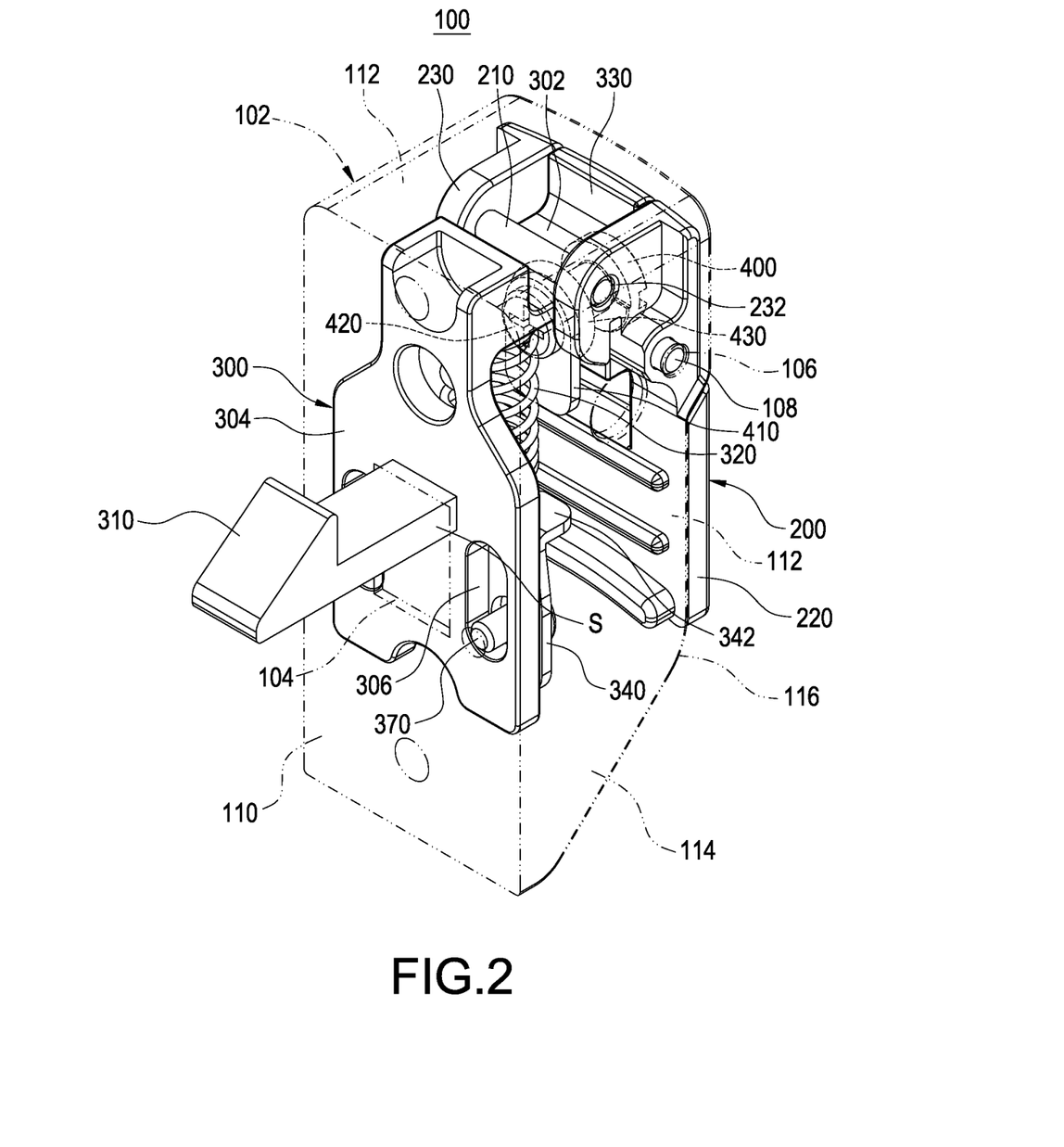
FIG. 2 is a perspective schematic view of the handle structure in the first position according to the present invention.
Figure 3:
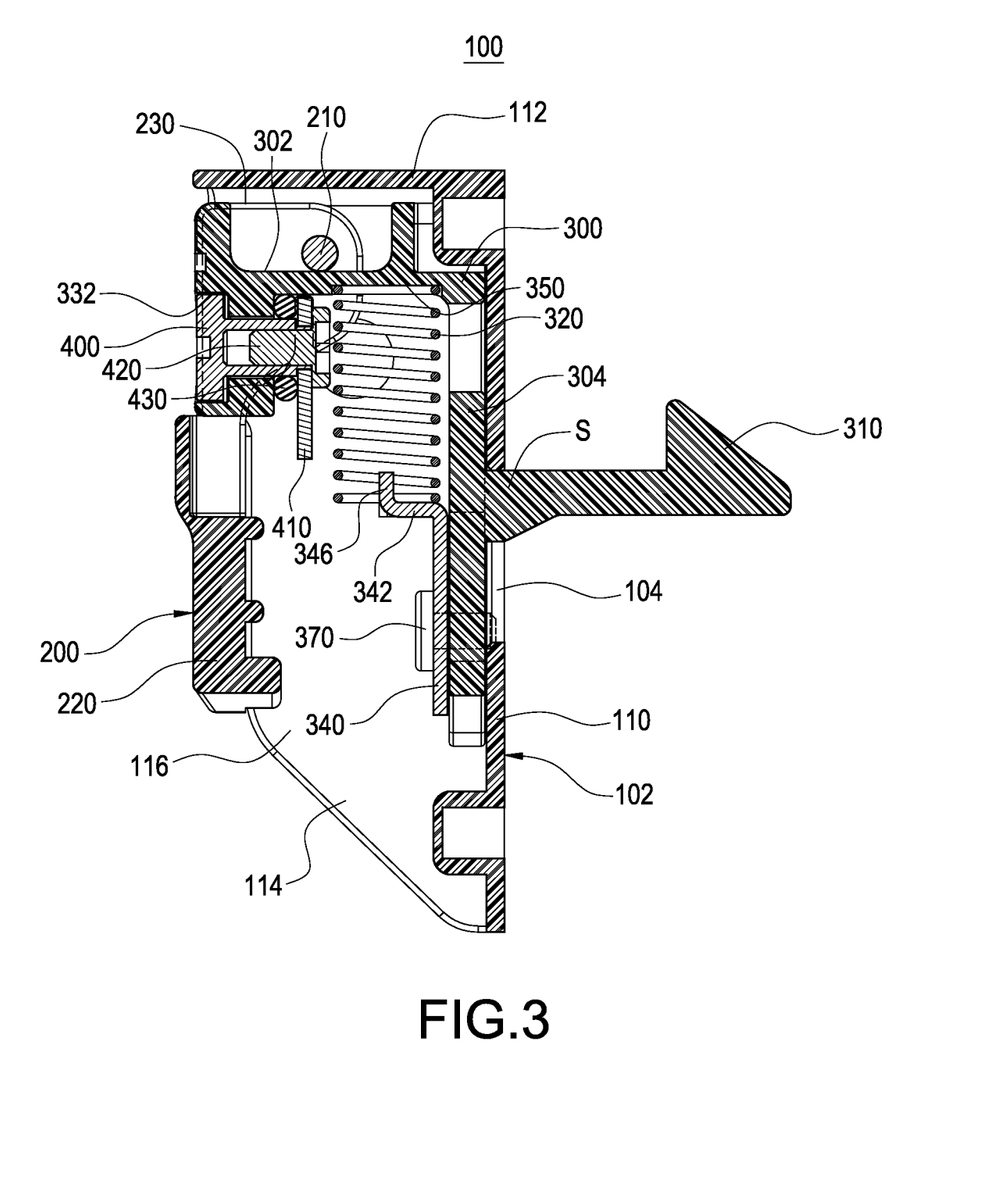
FIG. 3 is a sectional view of the handle structure in the first position according to the present invention.

Referring to FIGS. 1-3, a preferred embodiment of the present invention provides a handle structure 100, which comprise a shell 102, a handle 200, and a sliding member 300. The shell 102 further includes an aperture 104, a bottom wall 110, a plurality of side walls 112, and an opening 116. The bottom wall 110 and the plurality of side walls surround to form an accommodating space 114 for accommodating the sliding member 300. As embodied in FIG. 1, the accommodating space 114 is preferably encircled by one bottom wall 110 and three side walls 112. The opening 116 is formed between the handle 200 and the bottom wall 110, and communicates with the accommodating space 114. On end of the handle 200 pivots to the shell 102 and be able to rotate relative to the shell 102. The handle 200 further includes a pressing portion 210, a grip 220, an eccentric portion 230, a hole 232 and a second axle hole 240. The eccentric portion 230 is provided on one end of the grip 220 and extends to the sliding member 300. The second axle hole 240 is formed at the side edge of the handle 200 to allow the handle 200 to axially rotate along the second axle hole 240.

The shell 102 includes a first axle hole 106 and a pivot 108. The pivot 108 penetrates through the first axle hole 106 and the second axle hole 240 to allow the grip 220 to rotate relative to the pivot 108. The hole 232 is formed on the eccentric portion 230 for being penetrated with the pressing portion 210 which is formed as a pin rod. In other words, as embodied in FIG. 2, the pressing portion 210 penetrates through the hole 232 and is positioned on the eccentric portion 230. However, in other embodiment, the pressing portion 210 can also be a part of the eccentric portion 230, and can directly push the pressing area 302. One side of the eccentric portion 230 can also form a positioning groove 234, which will be described later. A side of the grip 220 facing the sliding member 300 is further provided with a plurality of protrusions 260 for user to pull out the case box (no shown in the FIG.).

Figure 4:
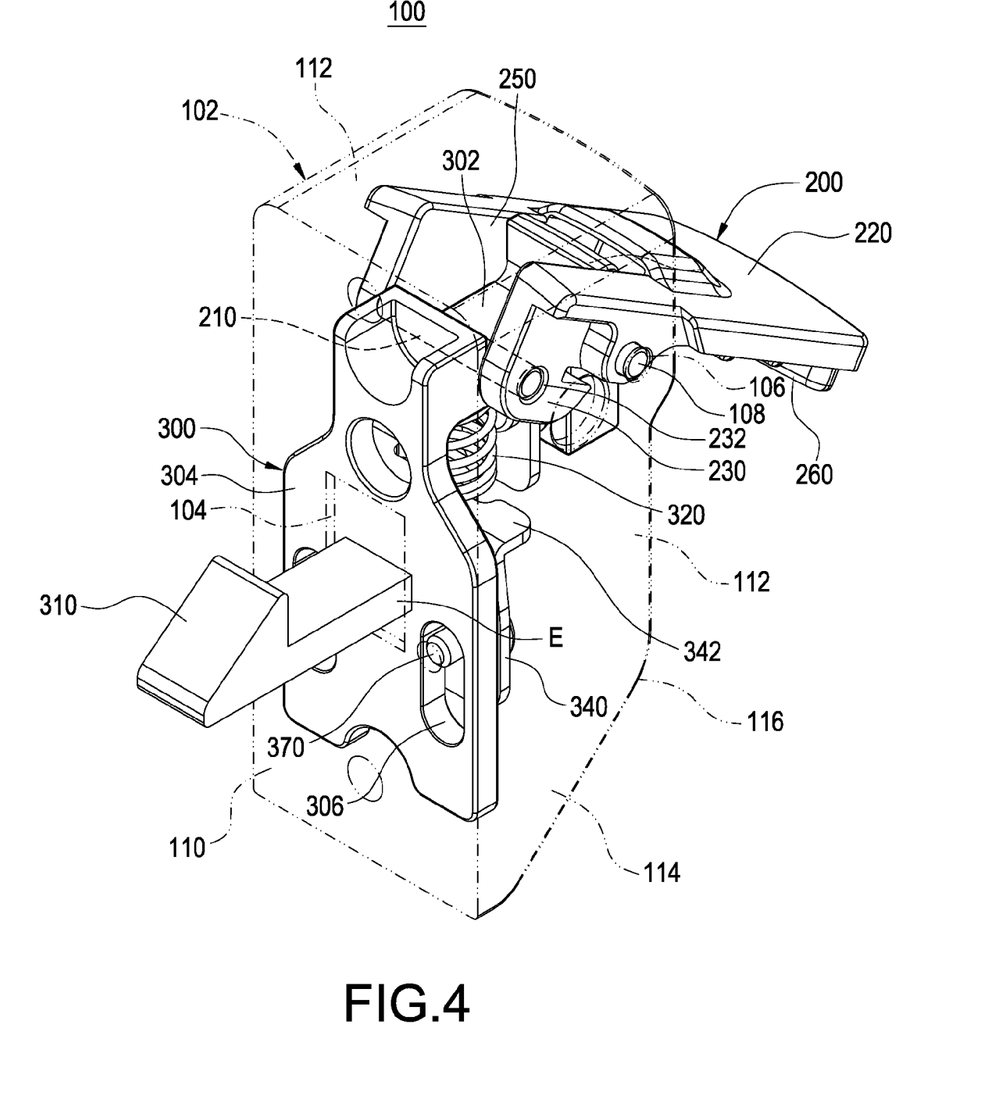
FIG. 4 is a perspective schematic view of the handle structure rotating relative to the shell to force the hooking portion moving to a second position according to the present invention.
Figure 5:
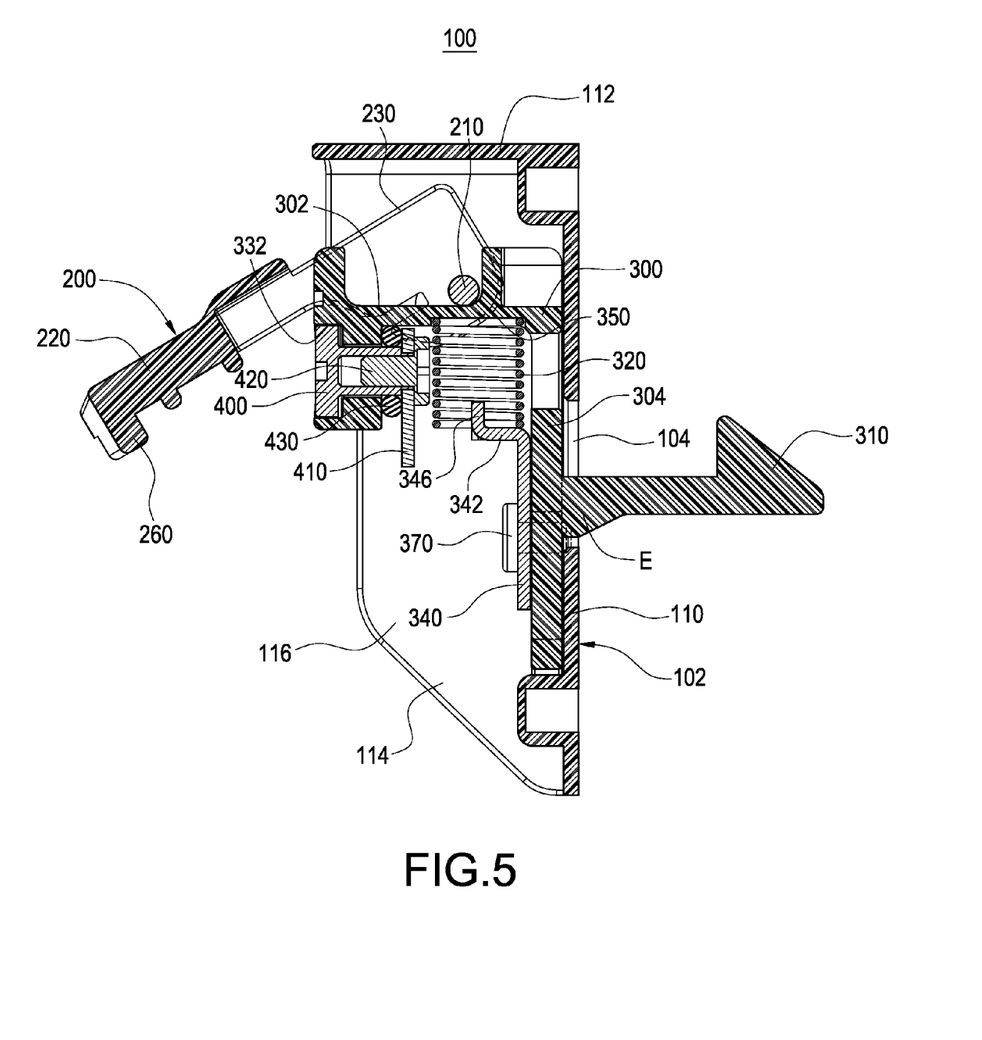
FIG. 5 is a sectional view of FIG. 4 according to the present invention.

The sliding member 300 is installed on the shell 102 corresponding to the handle 200. The sliding member 300 includes a hooking portion 310 penetrating through the aperture 104 and a pressing area 302 pressed by the pressing portion 210 to move the hooking portion 310 from a first position (S) to a second position (E) (as shown in FIG. 4 or FIG. 5). As embodied in FIGS. 1-3, the sliding member 300 further includes a sliding body 304, an elastic member 320, an extension block 330, a barrier plate 340, a first restriction portion 350 and a second restriction portion 342. The extension block 330 extends from a side of the sliding body 304 through the pressing area 302. The extension block 330 is parallel to the sliding body 304. The first restriction portion 350 is provided on an opposite side of the pressing area 302, which means the first restriction portion 350 is located between the sliding body 304 and the extension block 330. The barrier plate 340 can be integrally or detachably positioned on one side of the sliding body 304, and also can be positioned on the shell 102 by a positioning member 370 penetrating through a long narrow hole 306.

It is noteworthy that, even though the positioning member 370 positions the siding member 300 on the shell 102, the sliding member 300 can still move upward and downward relative to the positioning member 370 and the shell 102 in the long narrow hole 306. The second restriction portion 342 is provided on a side of the barrier plate 340. One end of the elastic member 320 is against the first restriction portion 350, and the other end is against the second restriction portion 342. In the present embodiment, the elastic member 320 is preferably a compressed spring. The second restriction portion 342 of the barrier plate 340 further includes a positioning convex part 346 vertically protruding from the second positioning portion 342 to position the elastic member 320. The hooking portion 310 protrudes from another side of the sliding body 304 opposite to the barrier plate 340.

Figure 6:
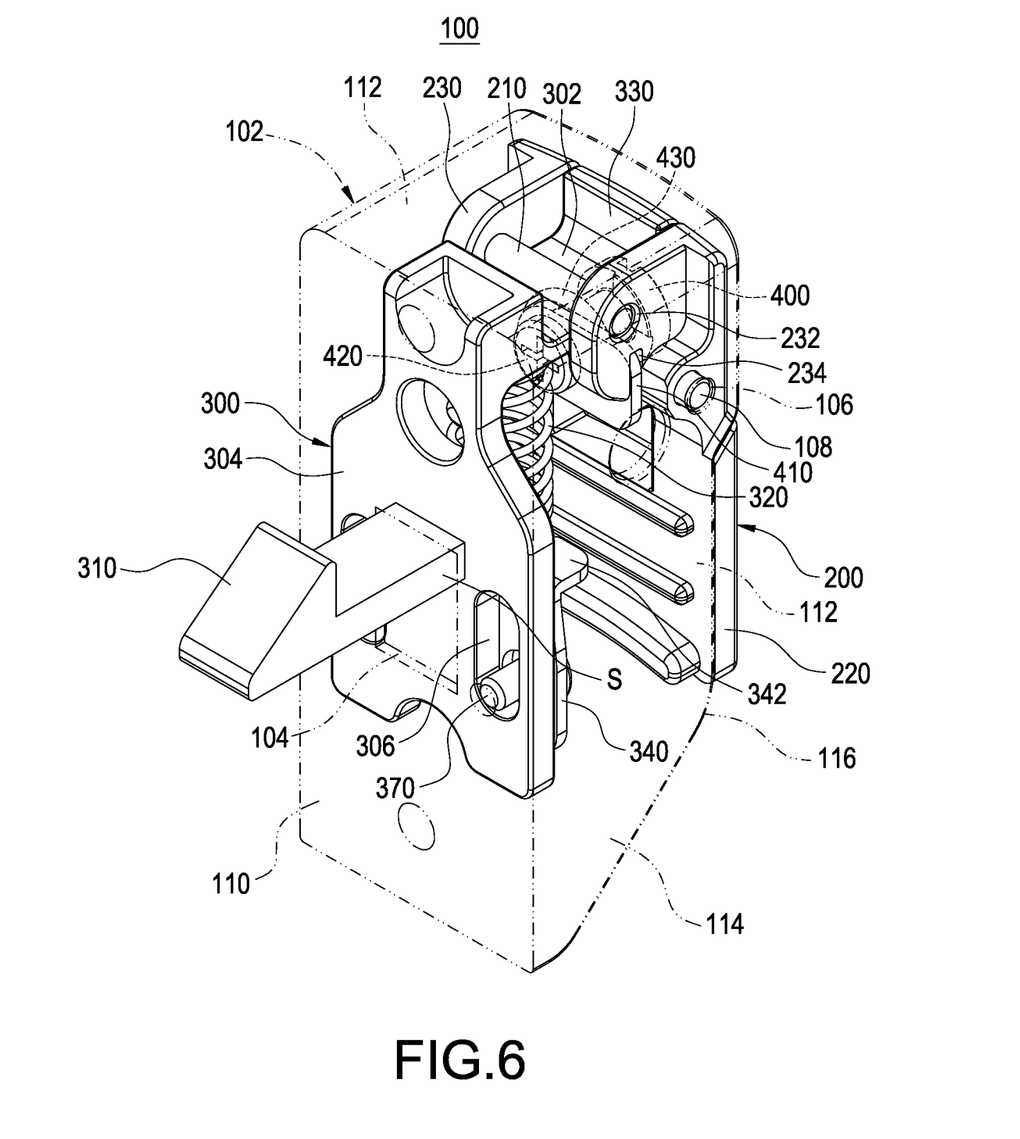
FIG. 6 is a perspective schematic view of a locking unit in locking mode according to the present invention.

Please refer to FIGS. 1 and 6, the locking unit 400 is provided on the extension block 330 extended from the pressing area 302. The handle 200 is provided with a gap 250 corresponding to the extension block 330 to expose the locking unit 400. The locking unit 400 includes a connecting member 410, a positioning member 420 positioning the connecting member 410, and a gasket 430. A through hole 332 is formed on the extension block 330, and the extension block 330 can be positioned by the positioning member 420 by penetrating the through hole 332. In the embodiment of FIG. 1 and FIG. 6, the locking unit 400 is preferably a bolt, and one end of the bolt is provided with an inner hole (not shown in the FIG.) for being locked with the positioning member 420, such as a screw. The gasket 430 can increase the friction to prevent the positioning member from loosing.

Therefore, when the locking unit 400 rotates relative to the extension block 330, the connecting member 410 rotates along with the locking unit 400 to be against the positioning groove 234 of the handle 200 and further restricts rotation of the handle 200 relative to the shell 102. When the connecting member 410 of the locking unit 400 releases the restriction for the positioning groove 234 of the eccentric portion 230, the handle 200 can rotate relative to the shell 102 and move the hooking portion 310.

It should be noted that, the locking unit 400 of the present embodiment is a bolt, but not limited thereto. In other preferred embodiments, the locking unit 400 can also be replaced by a keypad lock, a key lock, or any other suitable member.

As embodied in FIGS. 4 and 5, when the handle 200 rotates relative to the shell 102 (the handle 200 axially rotates along the pivot 108), the pressing portion 210 of the handle 200 pushes the pressing area 302 to force the hooking portion 310 of the sliding member 300 to move to a lower end point, which is also known as the second position E. Meanwhile, the sliding member 300 pushes and compresses the elastic member 320 to force the hooking portion 310 to vertically move from the first position S to the second position E. Please refer to FIGS. 2 and 3, when releasing the handle 200, the elastic force of the elastic member 320 moves the sliding member 300 upwardly, and thus the hooking portion 310 of the sliding member 300 can move from the second position E back to the first position S (upper end point).

Figure 7:
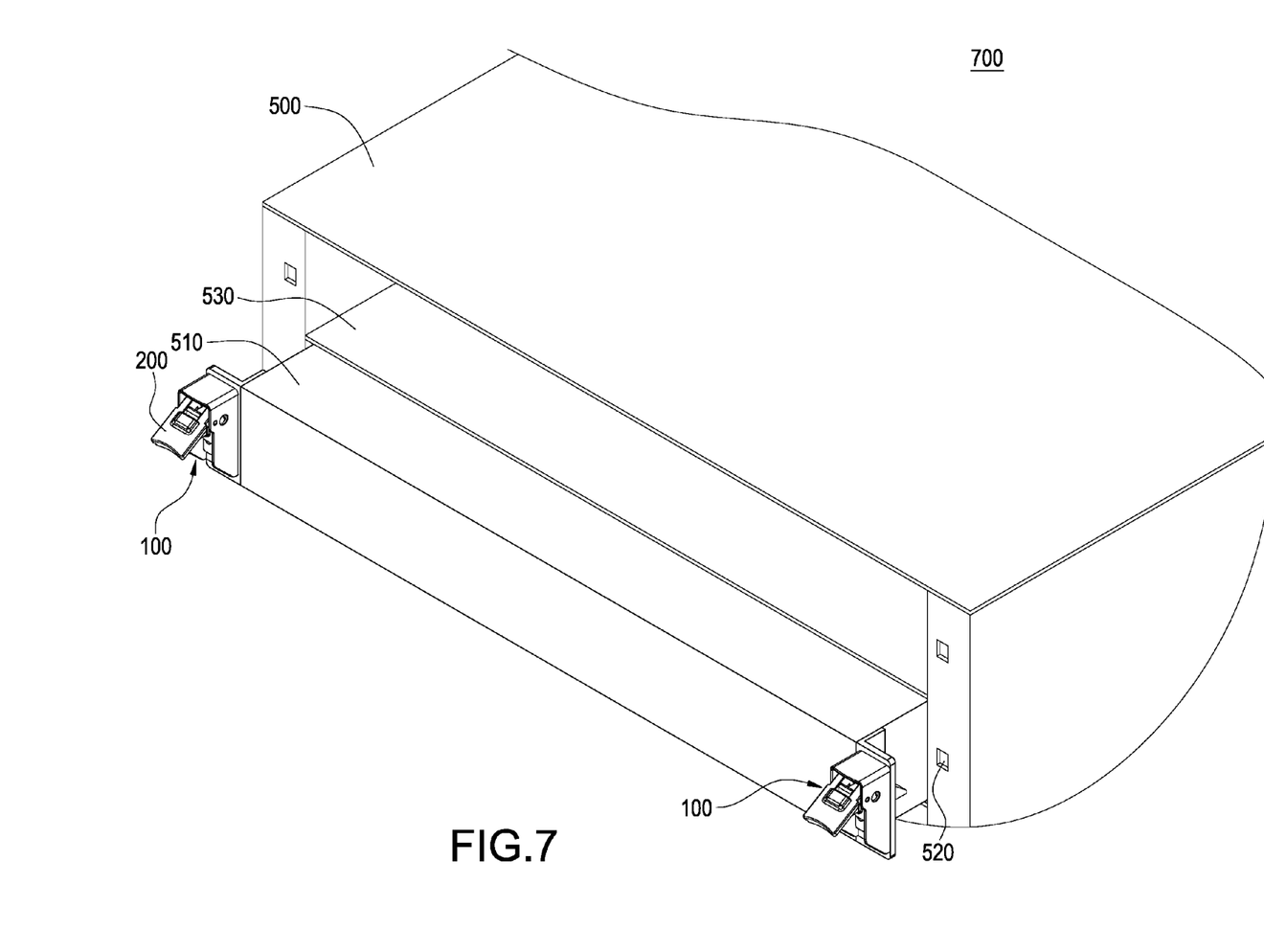
FIG. 7 is a schematic view of applying the handle structure in a server case body according to the present invention.

As embodied in FIG. 7, another preferred embodiment of the present invention provides a server 700 which works with a case rack 500 provided with a hooking hole 520. The server 700 includes a case box 510 and two handle structure 100 as described in the previous embodiment. The case box can be slidably disposed in a case rack. The two handle structures 100 are respectively provided on both sides of the case box 510 to engage the hooking portion 310 (not shown in the FIG.) with the hooking hole 520. The size of the handle structure 100 corresponding to the case box 510 can be 1 U size, but can also be 2-4 U in other embodiments and not limited thereto. All the elements, the way of connecting and functioning of the handle structure 100 please refer to the embodiments described above, which is not repeated here.

Please refer to FIGS. 1 and 7, when the user want to pull the case box 510 out of the case shelf 530, the user's finger can insert into the opening 116 and hold the grip 220 and the protrusions 260 to rotate the grip 220. The pressing portion 210 of the handle 200 pushes the pressing area 302 to force the hooking portion 310 of the sliding member 300 to move to a lower end point, which is also known as the second position E. Meanwhile, the hooking portion 310 is disengaged from the hooking hole 520 on the case rack 500, and the case box 510 can be pulled out accordingly. Similarly, when the handle structure 100 pushes the case box 510 back to the case shelf 530, the hooking portion 310 (with barbs at the end of the hook) can engage with the hooking hole 520 by the elastic member 320, thus the hooking portion 310 and the hooking hole 520 can elastically engage with each other. In other words, the elastic member 320 of the sliding member 300 will be back to the original position and push the hooking portion 310 back to the upper end point, which is known as the first position S.

Besides, in order to increase the anti-theft and locking function, the handle structure 100 is further provided with a locking unit 400. The rotation of the locking unit 400 drives the connecting member 410 to rotate to be against the positioning groove 234 of the handle 200, thereby restricting the rotation of the handle 200 relative to the shell 102 to achieve the anti-theft function. When the connecting member 410 of the locking unit 400 releases the restriction for the positioning groove 234, the handle 200 can rotate relative to the shell 102 and move the hooking portion 310.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A handle structure, comprising:
   a shell, provided with an aperture;
   a rotatable handle, one end of the handle pivoting on the shell, the handle comprising a pressing portion;
   a barrier plate; and
   a sliding member corresponding to the handle and installed in the shell, the sliding member comprising a sliding body, and a hooking portion, the sliding body being formed with two elongated holes, wherein the barrier plate and the hooking portion are disposed on opposite sides of the sliding body, wherein two positioning members penetrate through the two elongated holes respectively and are fixed to the shell, so as to keep the sliding body in close contact with the shell;
   wherein the hooking portion penetrates through the aperture, and a pressing area, integrally extending from the sliding body, is pressed by the pressing portion when the handle is rotated so as to move the hooking portion from a first position to a second position,
   wherein an extension block further extends from the pressing area and has a through hole formed therein, and a locking unit penetrates through the through hole such that the locking unit is connected to a connecting member by a positioning member;
   wherein a positioning groove is formed on the handle, the locking unit is rotatable relative to the extension block by actuation by a user, the connecting member rotates along with the locking unit and is selectably positioned inside the positioning groove so as to prevent rotation of the handle relative to the shell.

2. The handle structure according to claim 1, further comprising an elastic member, wherein the sliding member further comprises a first positioning portion and a second positioning portion, the first positioning portion is located underneath the pressing area, the second positioning portion is provided on one end of the barrier plate, one end of the elastic member is against the first positioning portion, and another end of the elastic member is against the second positioning portion.

3. The handle structure according to claim 2, wherein the elastic member is a compressed spring, the barrier plate includes a positioning convex part vertically protruding from the second positioning portion to position the elastic member.

4. The handle structure according to claim 2, wherein the extension block extends parallel to the sliding body, the first positioning portion is formed between the extension block and the sliding body.

5. The handle structure according to claim 1, wherein the handle is provided with a gap corresponding to the extension block so as to expose the locking unit.

6. The handle structure according to claim 1, wherein the handle further comprises a grip, an eccentric portion, a hole, and a second axle hole, the eccentric portion is disposed on one end of the handle, the hole is formed on the eccentric portion, and the second axle hole is formed on a side edge of the handle.

7. The handle structure according to claim 6, wherein the shell comprises a first axle hole and a pivot, the pivot penetrates into the first axle hole and the second axle hole to allow the handle to rotate about the pivot.

8. The handle structure according to claim 7, wherein the pressing portion is a rod, the pressing portion penetrates through the hole so as to be positioned on the eccentric portion, one side of the eccentric portion (230) forms the positioning groove, a side of the grip corresponding to the sliding member is provided with a plurality of protrusions.

9. The handle structure according to claim 1, wherein the shell further comprises a bottom wall, a plurality of side walls, and an opening, the bottom wall and the plurality of side walls surround to form an accommodating space to accommodate the sliding member, the opening is formed between the handle and the bottom wall and communicates with the accommodating space.

10. A server working with a case rack provided with two hooking holes, the server comprises:
    a case body slidably disposed inside the case rack; and
    two handle structures, each having the structure recited in claim 1, the two handle structures are disposed on either side of the case body respectively, wherein each hooking portion engages with a corresponding one of the hooking holes.

* * * * *